United States Patent
Yanagisawa et al.

(10) Patent No.: US 8,677,607 B2
(45) Date of Patent: Mar. 25, 2014

(54) METHOD OF MANUFACTURING MAGNETORESISTIVE ELEMENT

(75) Inventors: Takumi Yanagisawa, Tokyo (JP);
Masaru Hirose, Tokyo (JP); Shunji Saruki, Tokyo (JP)

(73) Assignee: TDK Corporation, Tokyo (JP)

( * ) Notice: Subject to any disclaimer, the term of this patent is extended or adjusted under 35 U.S.C. 154(b) by 1783 days.

(21) Appl. No.: 12/044,427

(22) Filed: Mar. 7, 2008

(65) Prior Publication Data
US 2013/0000103 A1    Jan. 3, 2013

(51) Int. Cl.
| | |
|---|---|
| *G11B 5/127* | (2006.01) |
| *H04R 31/00* | (2006.01) |
| *G11B 5/31* | (2006.01) |
| *G11B 5/39* | (2006.01) |
| *G01R 3/00* | (2006.01) |
| *G01R 15/00* | (2006.01) |
| *G01R 19/00* | (2006.01) |

(52) U.S. Cl.
CPC .............. *G11B 5/127* (2013.01); *G11B 5/3166* (2013.01); *G11B 5/3173* (2013.01); *G11B 5/3196* (2013.01); *G11B 5/3903* (2013.01); *G01R 3/00* (2013.01); *G01R 15/00* (2013.01); *G01R 19/00* (2013.01)
USPC ..................... 29/603.09; 29/603.07; 29/603.1; 324/537; 360/324.1; 360/324.11; 360/324.12; 360/324.2

(58) Field of Classification Search
CPC ...... G11B 5/127; G11B 5/455; G11B 5/3173; G11B 5/3196; G11B 5/3903
USPC .............. 29/603.07, 603.09, 603.1, 705, 729, 29/737; 324/537; 360/324.1, 324.2, 360/324.11, 324.12
See application file for complete search history.

(56) References Cited

U.S. PATENT DOCUMENTS

| | | | | |
|---|---|---|---|---|
| 5,721,488 | A | * | 2/1998 | Sakai et al. ................... 324/210 |
| 5,854,554 | A | * | 12/1998 | Tomita et al. ................. 324/210 |
| 5,991,113 | A | | 11/1999 | Meyer et al. |
| 6,146,776 | A | | 11/2000 | Fukuzawa et al. |
| 6,847,507 | B2 | | 1/2005 | Wang et al. |
| 6,859,678 | B1 | | 2/2005 | Barada et al. |
| 6,943,545 | B2 | * | 9/2005 | Patland et al. ................ 324/210 |
| 7,035,030 | B2 | * | 4/2006 | Takayoshi et al. .............. 360/67 |
| 7,283,326 | B2 | | 10/2007 | Nakayama |
| 7,320,170 | B2 | | 1/2008 | Kao et al. |
| 2003/0234646 | A1 | * | 12/2003 | Patland et al. ................ 324/210 |
| 2005/0200237 | A1 | | 9/2005 | Yamazaki et al. |
| 2006/0187564 | A1 | | 8/2006 | Sato et al. |
| 2006/0216837 | A1 | | 9/2006 | Hachisuka et al. |
| 2006/0221511 | A1 | | 10/2006 | Saruki et al. |

FOREIGN PATENT DOCUMENTS

| | | |
|---|---|---|
| JP | A 2001-297403 | 10/2001 |
| JP | A 2002-133621 | 5/2002 |
| JP | A 2006-185548 | 7/2006 |

* cited by examiner

*Primary Examiner* — Paul D Kim
(74) *Attorney, Agent, or Firm* — Oliff PLC

(57) ABSTRACT

The method according to the present invention includes the steps of: sequentially applying a plurality of different voltages to an MR element and sequentially detecting output signals from the MR element; and eliminating the MR element as a defective product when an evaluation value, based on a difference of SN ratios of the output signals from the MR element respectively obtained for each applied voltage, is less than a threshold value, and selecting the MR element as a non-defective product when the evaluation value is greater than or equal to the threshold value.

7 Claims, 18 Drawing Sheets

Fig.11

| Sample Number | S* | | | N* | | | ΔSN [dB] | | |
|---|---|---|---|---|---|---|---|---|---|
| | 50mV | 150mV | 300mV | 50mV | 150mV | 300mV | 50mV | 150mV | 300mV |
| OK01 | 1 | 1.36 | 1.98 | 1 | 1.04 | 1.19 | 0.0 | 2.3 | 4.4 |
| OK02 | 1 | 1.47 | 1.91 | 1 | 1.11 | 1.13 | 0.0 | 2.5 | 4.6 |
| OK03 | 1 | 1.52 | 2.02 | 1 | 1.04 | 1.15 | 0.0 | 3.3 | 4.9 |
| OK04 | 1 | 1.50 | 2.11 | 1 | 1.07 | 1.11 | 0.0 | 3.0 | 5.6 |
| OK05 | 1 | 1.42 | 1.87 | 1 | 1.11 | 1.14 | 0.0 | 2.1 | 4.3 |
| FA01 | 1 | 1.30 | 1.82 | 1 | 1.24 | 1.43 | 0.0 | 0.5 | 2.1 |
| FA02 | 1 | 1.33 | 1.86 | 1 | 1.19 | 1.30 | 0.0 | 0.9 | 3.1 |
| FA03 | 1 | 1.38 | 1.93 | 1 | 1.20 | 1.38 | 0.0 | 1.2 | 2.9 |
| FA04 | 1 | 1.33 | 1.73 | 1 | 1.20 | 1.42 | 0.0 | 0.9 | 1.7 |
| FA05 | 1 | 1.22 | 1.75 | 1 | 1.13 | 1.21 | 0.0 | 0.7 | 3.2 |
| FA06 | 1 | 1.21 | 1.74 | 1 | 1.18 | 1.31 | 0.0 | 0.3 | 2.4 |
| FA07 | 1 | 1.25 | 1.62 | 1 | 1.08 | 1.18 | 0.0 | 1.3 | 2.8 |

Fig.12

| Sample Number | S [μV] | | | N [μV] | | | SN [dB] | | |
|---|---|---|---|---|---|---|---|---|---|
| | 50mV | 150mV | 300mV | 50mV | 150mV | 300mV | 50mV | 150mV | 300mV |
| OK01 | 5176.7 | 7042.5 | 10239.0 | 65.9 | 68.4 | 78.3 | 37.9 | 40.2 | 42.3 |
| OK02 | 6843.0 | 10071.0 | 13090.6 | 60.7 | 67.2 | 68.6 | 41.0 | 43.5 | 45.6 |
| OK03 | 5963.0 | 9063.2 | 12034.3 | 68.1 | 70.6 | 78.0 | 38.8 | 42.2 | 43.8 |
| OK04 | 6668.3 | 10009.4 | 14047.1 | 60.4 | 64.3 | 67.0 | 40.9 | 43.8 | 46.4 |
| OK05 | 7125.8 | 10104.8 | 13351.8 | 65.4 | 72.5 | 74.4 | 40.7 | 42.9 | 45.1 |
| FA01 | 5407.6 | 7045.3 | 9836.7 | 53.1 | 65.6 | 76.0 | 40.2 | 40.6 | 42.2 |
| FA02 | 6036.8 | 8004.2 | 11222.0 | 64.1 | 76.3 | 83.1 | 39.5 | 40.4 | 42.6 |
| FA03 | 8017.0 | 11039.9 | 15465.2 | 66.7 | 80.0 | 91.8 | 41.6 | 42.8 | 44.5 |
| FA04 | 7540.5 | 10014.3 | 13074.7 | 69.1 | 83.1 | 98.1 | 40.8 | 41.6 | 42.5 |
| FA05 | 6568.6 | 8012.0 | 11519.0 | 55.9 | 63.0 | 67.7 | 41.4 | 42.1 | 44.6 |
| FA06 | 6657.7 | 8086.0 | 11556.7 | 61.6 | 72.4 | 80.9 | 40.7 | 41.0 | 43.1 |
| FA07 | 8080.8 | 10074.1 | 13110.2 | 70.8 | 76.1 | 83.2 | 41.2 | 42.4 | 43.9 |

US 8,677,607 B2

METHOD OF MANUFACTURING MAGNETORESISTIVE ELEMENT

BACKGROUND OF THE INVENTION

1. Field of the Invention

The present invention relates to a method of manufacturing a magnetic device having a magnetoresistive (MR) element, and to an inspection device therefor.

2. Related Background Art

Recently, as a magnetic head structure, a structure in which a heater is incorporated into a magnetic head has been proposed (U.S. Pat. No. 5,991,113), while conventionally a magnetic head in which a heater is not incorporated has been well known. A magnetic head such as a heat-assisted magnetic head which allows a rise in the temperature of the magnetic head has also been proposed (Japanese Unexamined Patent Publication No. 2006-185548).

The inventor(s) of the present invention have worked on the development of magnetic heads, and found that there were, among manufactured magnetic heads, defective magnetic heads which had an increased noise component as the temperature increased while functioning normally at room temperature. In other words, it was found that there were magnetic heads in which the magnitude of the noise component included in the output signals from the magnetic heads was larger than a stipulated value when the temperature increased.

SUMMARY OF THE INVENTION

The inventor(s) of the present invention have attempted to eliminate, as defective products, defective magnetic heads having signal-to-noise (SN) ratios below or equal to a stipulated value at a high temperature in the magnetic head manufacturing process. However, manufacturing throughput deteriorates when a step of raising the temperature for SN ratio inspection is carried out. The inventors of the present invention have devised a method in which defective products having SN ratios below or equal to the stipulated value at high temperatures are sorted at room temperature. As this kind of method does not require the step of raising the temperature for SN ratio inspection, manufacturing throughput can be improved. Specifically variation of the SN ratio of an MR element, which becomes defective at a high temperature, becomes smaller than the variation of the SN ratio of a non-defective product when an applied voltage to the MR element is varied.

This inspection step for the method of manufacturing an MR element comprises the steps of varying the applied voltage to the MR element; and eliminating the MR element as a defective product when an evaluation value, based on the variation of the SN ratios obtained before and after the varying of the applied voltage, is smaller than a threshold value. This evaluation value may include a correction factor when required.

BRIEF DESCRIPTION OF THE DRAWINGS

FIG. 11 is a table showing a relationship of S*, N*, and ΔSN for each sample for different applied voltages;
FIG. 12 is a table showing a relationship of S, N, and SN for each sample for different applied voltages.

DESCRIPTION OF THE PREFERRED EMBODIMENTS

Figure 1:
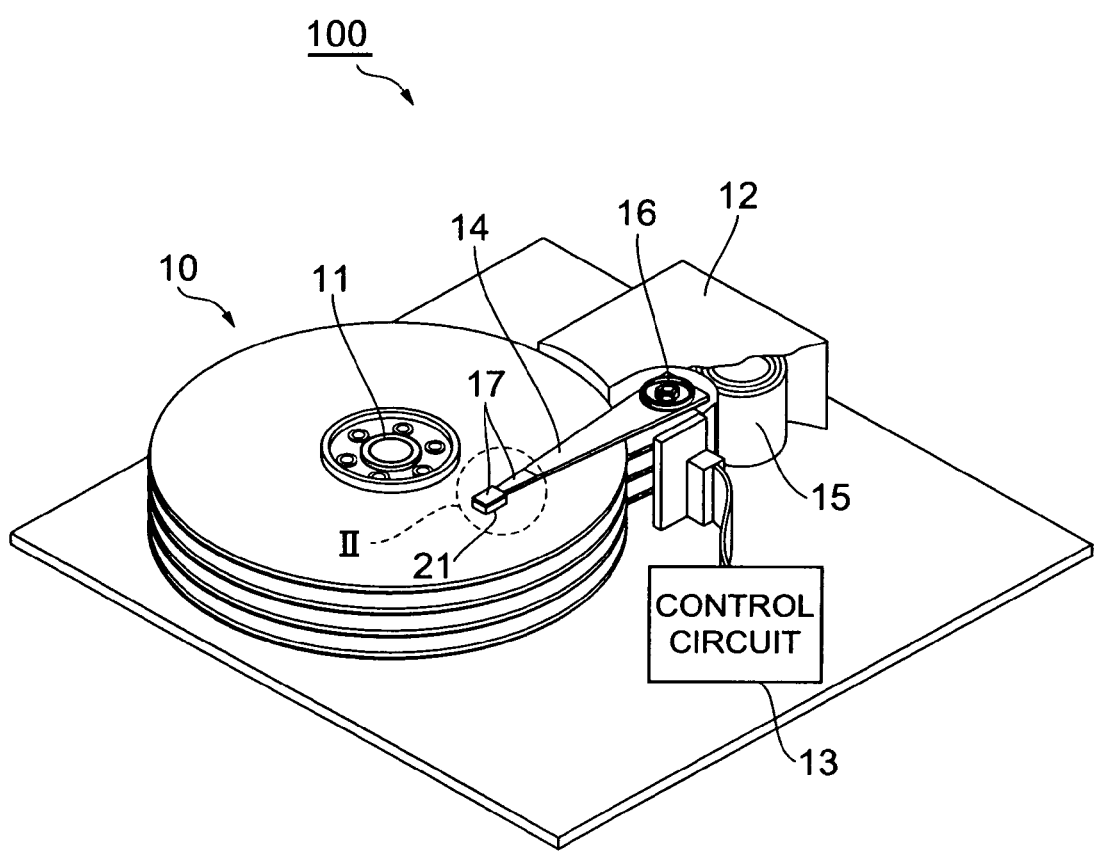
FIG. 1 is a perspective view of a hard disk device.

FIG. 1 is a perspective view of a hard disk device according to an embodiment.

A hard disk device 100 comprises magnetic disks 10 which are a plurality of magnetic recording media which are rotated around a rotating shaft of a spindle motor 11, an assembly carriage device 12 for positioning a magnetic head 21 on a track, and a control circuit 13 which performs recording/reproducing by controlling write and read operations of this magnetic head 21.

A plurality of drive arms 14 are provided in the assembly carriage device 12. These drive arms 14 can be swung about a pivot-bearing axis 16 by means of a voice coil motor (VCM) 15 and are stacked in a direction along this axis 16. A head gimbal assembly (HGA) 17 is attached to a tip end portion of each drive arm 14. The magnetic head 21 is provided in each HGA 17 so as to face the front surface of the magnetic disk 10. The surface facing the front surface of the magnetic disk 10 is a media-facing surface S of the magnetic head 21 (also called an air bearing surface, see FIG. 2). Note that, the magnetic disks 10, the drive arms 14, the HGAs 17, and the magnetic heads 21 may be provided singularly.

Figure 2:
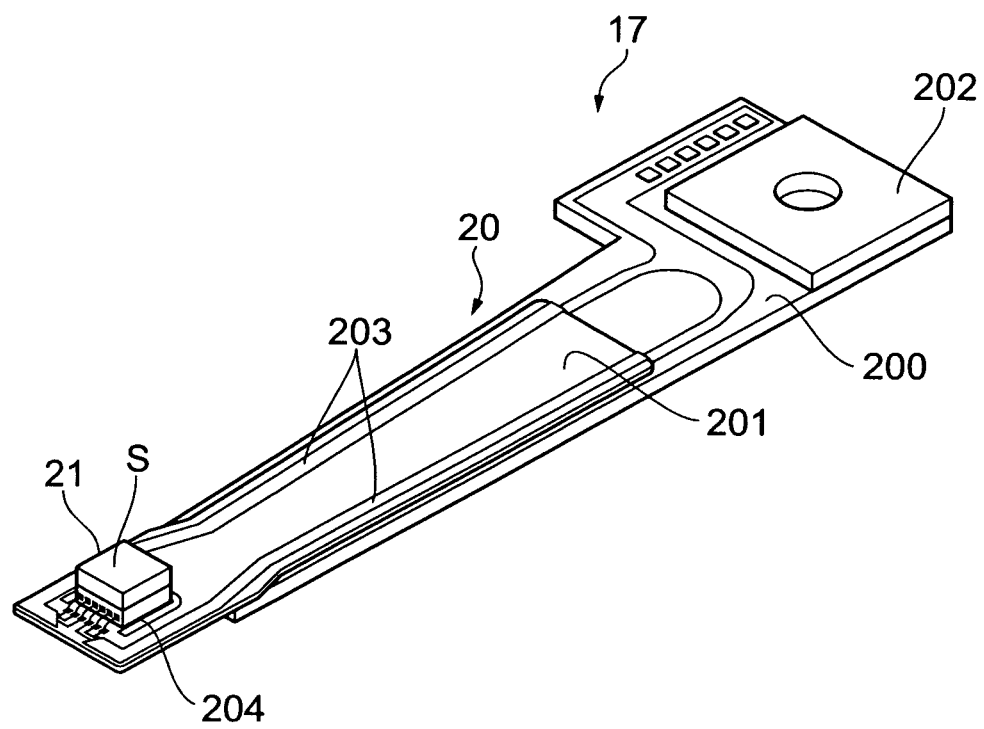
FIG. 2 is a perspective view of an HGA.

FIG. 2 is a perspective view of the HGA 17. The media-facing surface S of the HGA 17 is shown facing upward in this drawing.

The HGA 17 is configured by fixing a magnetic head 21 to a tip end portion of a suspension 20, and electrically connecting one end of a wire member 203 to a terminal electrode of this magnetic head 21. The suspension 20 is mainly configured from a load beam 200, an elastic flexure 201 fixed onto and supported by this load beam 200, a tongue portion 204 formed on a tip end of the flexure in the shape of a leaf spring, a base plate 202 provided at a base portion of the load beam 200, and a wire member 203 provided on the flexure 201 and formed from a lead conductor and a connection pad electrically connected to both ends of the lead conductor.

Note that the structure of the suspension in the HGA 17 is clearly not limited to the above-described structure. Also note that while not shown in the drawing, an IC chip for head drive may be mounted in the middle of the suspension 20.

Figure 3:
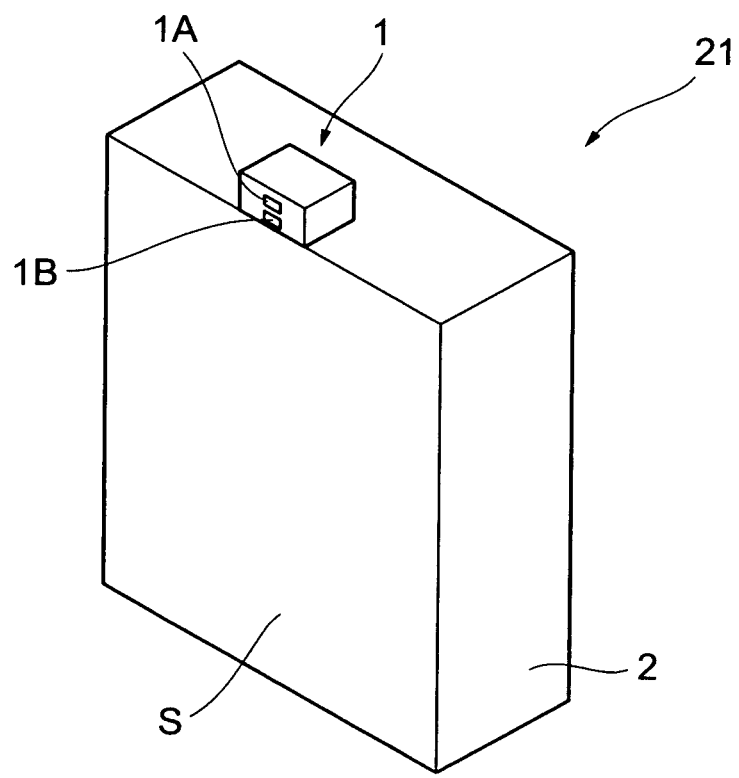
FIG. 3 is a perspective view of a magnetic head.
Figure 3:
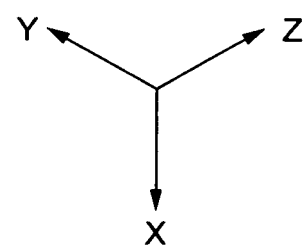

FIG. 3 is a perspective view of the magnetic head 21.

A magnetic head portion 1 is fixed to one end of a slider substrate 2. A pattern, not shown in the drawing, for floating the magnetic head stably when the magnetic disk is rotated, is formed in a media-facing surface S of the slider substrate. The slider substrate 2 is formed from AlTiC (Al$_2$O$_3$—TiC) for example. When a highly heat-conductive substrate is used as the slider substrate 2, the substrate has a heat dissipation function.

The magnetic head portion 1 comprises a writing element 1A for magnetic information, and an MR element 1B which is a reading element for magnetic information. The tip end of the writing element 1A and the magnetosensitive surface of the MR element 1B are positioned on the same side as the media-facing surface S. The arrangement direction of the writing element 1A and the MR element 1B is along the track of the magnetic disk 10, and in the media-facing surface S a width direction perpendicular to this arrangement direction is the track width direction. When setting an X-Y-Z rectangular coordinate system as shown in the drawing, the above-described arrangement direction corresponds to the X-axis direction, and the track width direction corresponds to the Y-axis direction.

Figure 4:
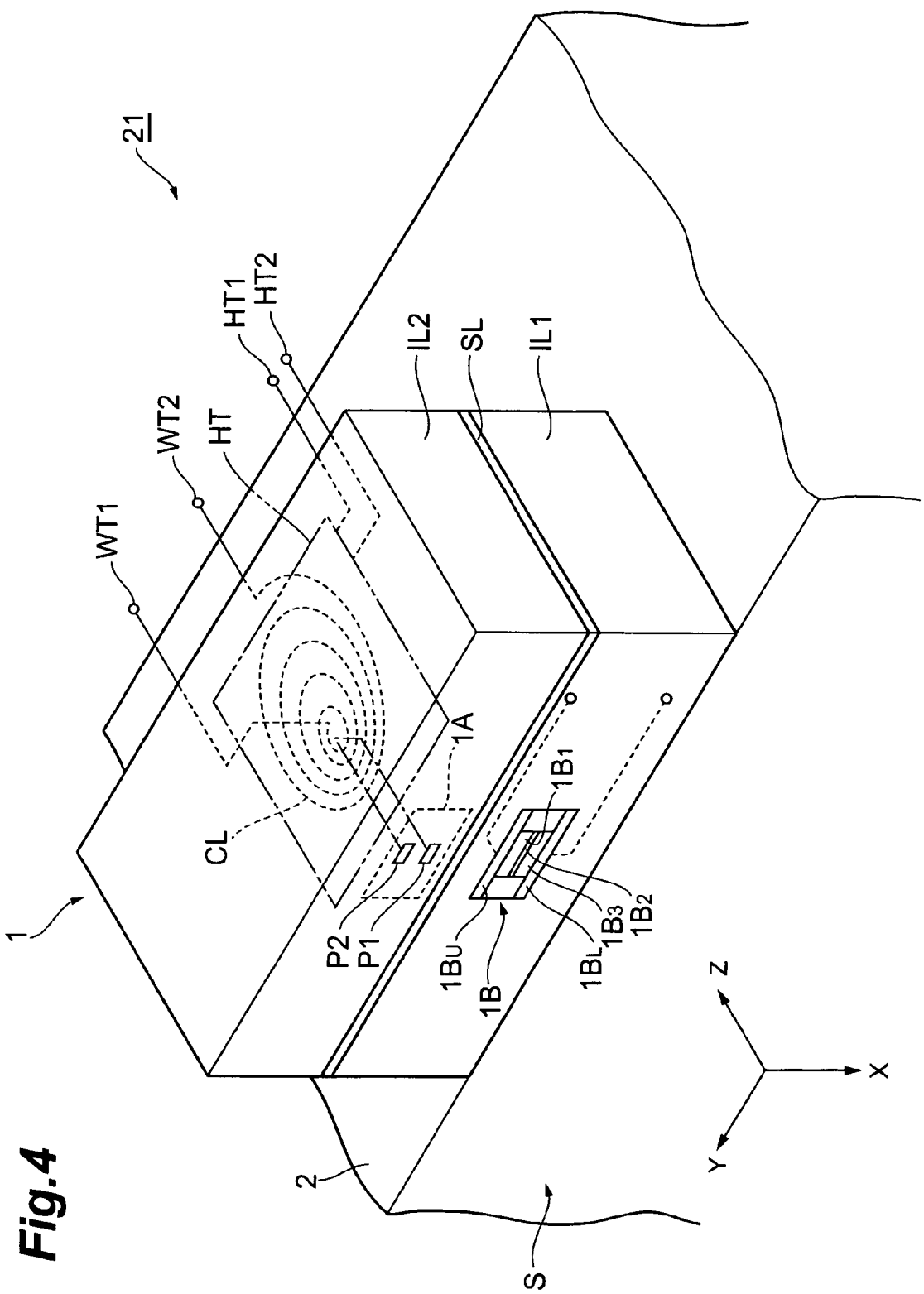
FIG. 4 is an enlarged perspective view of a magnetic head portion.

FIG. 4 is an enlarged perspective view of the magnetic head portion.

The magnetic head portion 1 comprises a magnetic shield layer SL between a lower insulation layer IL1 and an upper insulation layer IL2. The MR element 1B is embedded in the lower insulation layer IL1 of the slider substrate 2 side of the magnetic shield layer SL, and the writing element 1A is embedded in the upper insulation layer IL2. End surfaces of both the MR element 1B and the writing element 1A are exposed in the media-facing surface S.

The writing element 1A has a main pole P1 and an auxiliary pole P2, and a coil CL is provided to enclose the magnetic flux passing through these poles. A heater HT is embedded in the insulation layer of the lower portion of the coil CL. Although as the present example, a magnetic head portion comprising a heater HT is shown in the drawing, the present invention can also be applied to a magnetic head portion not comprising a heater. The writing element 1A employs a perpendicular magnetic recording method, however it can use a longitudinal magnetic recording method, and a heat-assisted magnetic recording method can also be applied. U.S. Pat. No. 5,991,113 is incorporated herewith by reference as a detailed structure of a magnetic device comprising a heater, however a heater of a pulse waveform shape or a heater of an interdigital structure can also be employed.

The MR element 1B is formed from an upper shield electrode $1B_U$, a lower shield electrode $1B_L$, and an MR element film interposed between the upper shield electrode $1B_U$ and the lower shield electrode $1B_L$. The MR element film of the present example is a tunnel magnetoresistive (TMR) element film in which a tunnel barrier layer $1B_2$ is interposed between a free layer $1B_1$ and a fixed layer $1B_3$. A terminal RT1 and a terminal RT2 are connected to the upper shield electrode $1B_U$ and the lower shield electrode $1B_L$ respectively. It is also possible to employ a giant magnetoresistive (GMR) element as the MR element 1B. The structure and the material of the MR element film described in U.S. Pat. Nos. 6,146,776, 7,283,326, and 7,320,170, for example, is referred to and cited.

Figure 5:
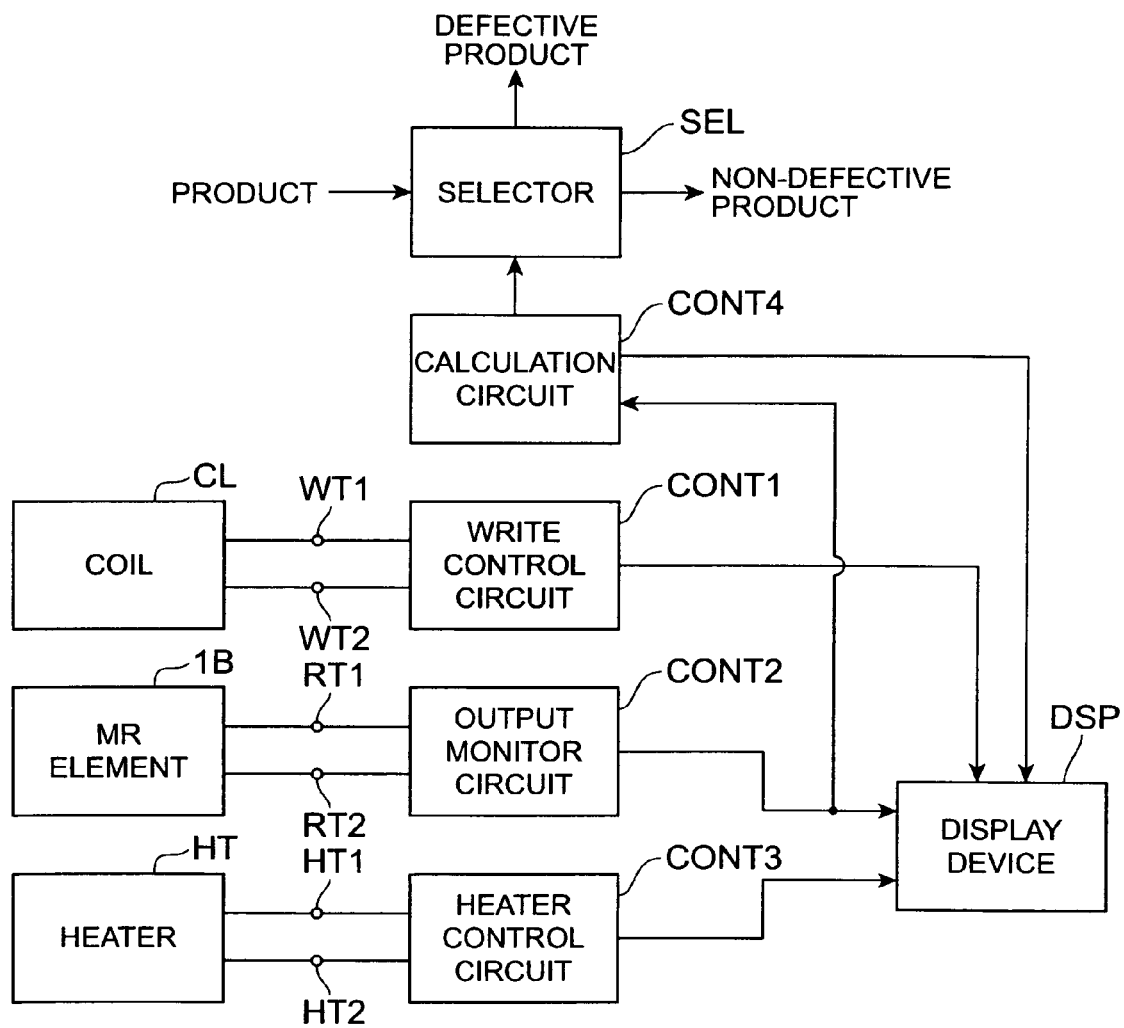
FIG. 5 is a block diagram of an inspection device.

FIG. 5 is a block diagram of an inspection device.

A write control circuit CONT1 is connected between a terminal WT1 and a terminal WT2 provided on either end of the coil CL. The electrodes on either end of the MR element 1B are connected to the terminal RT1 and the terminal RT2 respectively. The terminal RT1 and the terminal RT2 are connected to an output monitor circuit CONT2. The upper shield electrode and the lower shield electrode are connected to the terminal RT1 and the terminal RT2 respectively when the MR element 1B is a TMR element, however a GMR element can also be used as the MR element 1B.

The heater HT is a resistance heater or an induction heater, and a terminal HT1 and a terminal HT2 of either end of the heater HT are connected to a heater control circuit CONT3. The temperature of the heater HT can be directly or indirectly determined as needed.

Write information output to the coil CL from the write control circuit CONT1 is displayed on a display device DSP. The output monitor circuit CONT2 applies voltage between the terminal RT1 and the terminal RT2 of the MR element 1B, and monitors the sense current flowing between the terminal RT1 and the terminal RT2 at the time of voltage application. The output monitor circuit CONT2 may monitor resistance between both ends of the MR element 1B. In either case, the output signal from the MR element 1B is detected by the output monitor circuit CONT2 and the output monitor circuit CONT2 detects a signal component S and a noise component N included in the output signal. The signal component S and the noise component N are input into a calculation circuit CONT4 together with an applied voltage V to the MR element 1B. The applied voltage V is sequentially varied as follows: V1 equals 50 mV, V2 equals 150 mV, and V3 equals 300 mV.

Based on the input values, the calculation circuit CONT4 calculates the SN ratio obtained when the applied voltage V equals V1, and the SN ratio obtained when the applied voltage V equals V2, and thereby calculates the difference ΔSN of these SN ratios, and displays this on the display device DSP. Moreover, based on the input values, the calculation circuit CONT4 calculates the SN ratio obtained when the applied voltage V equals V2, and the SN ratio obtained when the applied voltage V equals V3, and thereby calculates the difference ΔSN of these SN ratios, and displays this on the display device DSP.

(Determination Method 1)

In the determination method 1, a determination flag is set to J, and in a case in which the applied voltage V equals V1 and V2, the MR element is determined to be a non-defective product, in other words "J=1," when a difference ΔSN (applied voltage V=V1, V2) calculated by the calculation circuit CONT4 is greater than or equal to a predetermined threshold value α1, and the MR element is determined to be a defective product, in other words "J=0," when this difference ΔSN is less than the threshold value α1. These determination results are transmitted to a selector SEL.

(Determination Method 2)

In the determination method 2, in a case in which the applied voltage V equals V2 and V3, the MR element may be determined to be a non-defective product, in other words "J=1," when a difference ΔSN (applied voltage V=V2, V3) calculated by the calculation circuit CONT4 is greater than or equal to a predetermined threshold value α2, and the MR element may be determined to be a defective product, in other words "J=0," when this difference ΔSN is less than the threshold value α2. These determination results are transmitted to the selector SEL.

Figure 6:
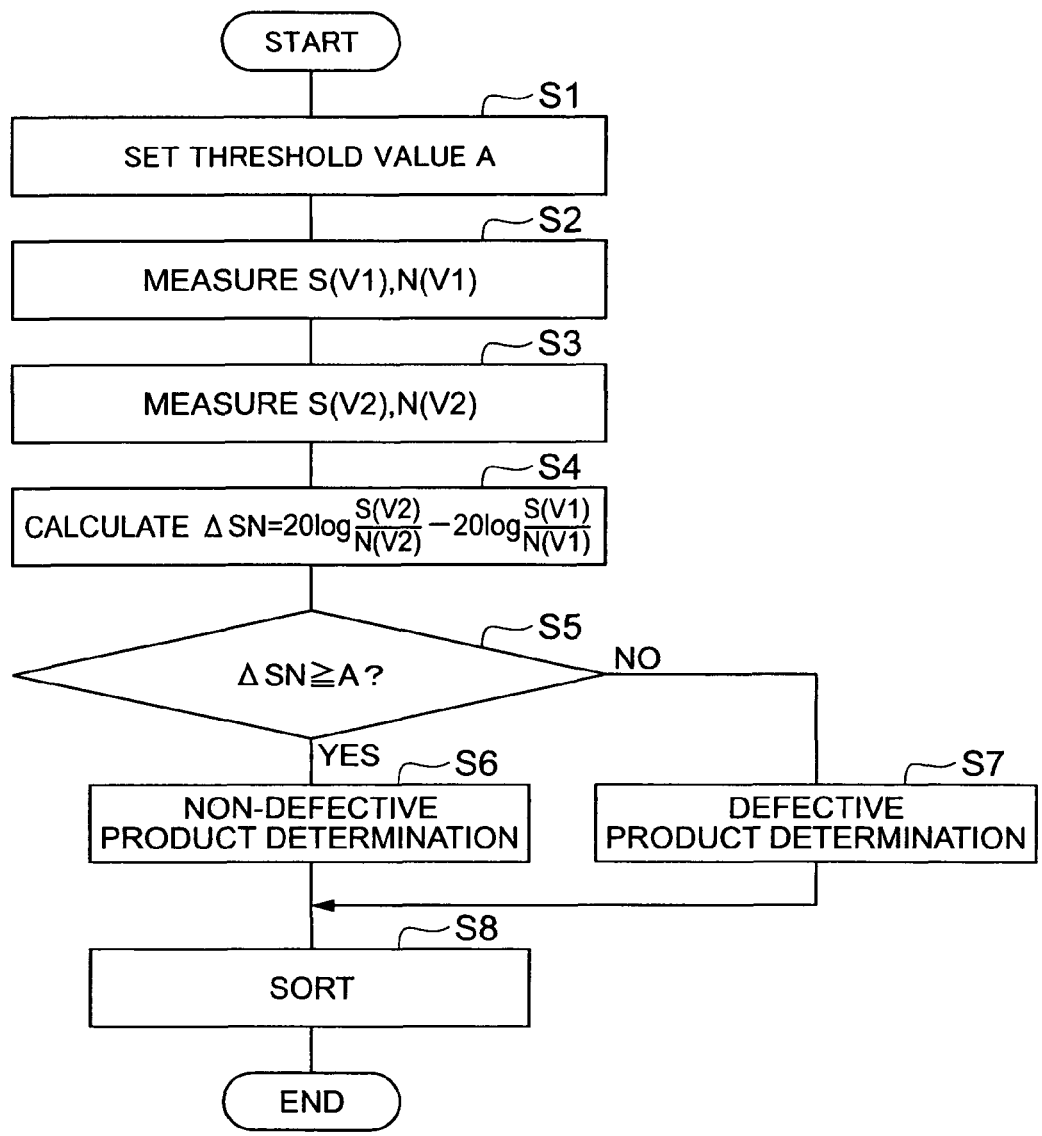
FIG. 6 is a flow chart of a determination.

FIG. 6 is a flow chart of the determination according to the determination method 1.

First, a threshold value A (=α1) is set (S1). Next, the signal component S (V1) and the noise component N (V1) obtained when the applied voltage V to the MR element equals V1 are measured (S2). Following this, the signal component S (V2) and the noise component N (V2) obtained when the voltage applied V to the MR element equals V2 are measured (S3). Next, the difference ΔSN of the SN ratios (applied voltage V=V1, V2) is calculated. In other words, the following is calculated (S4): ΔSN (V=V1, V2)=20 log(S(V2)/N(V))−20 log(S(V1)−N(V1)).

Thereafter, it is determined whether the ΔSN calculated in the above-described step is greater than or equal to the threshold value A. The MR element is determined to be a non-defective product when the ΔSN is greater than or equal to the threshold value A (YES) (S6). On the other hand, the MR element is determined to be a defective product when the ΔSN is less than the threshold value A (NO) (S7). After this determination, sorting is performed by the selector SEL (S8). Note that, although voltage V2 is set to be larger than voltage V1, the ΔSN becomes a negative value in subtraction to calculate the ΔSN when voltage V2 is smaller than voltage V1. To prevent this, the ΔSN may be multiplied by a minus sign to set the obtained positive value as a new ΔSN value.

In the determination method 2, the above-described steps may be implemented with the threshold value A set to equal α2 (α2>α1), and the applied voltages set to V2 and V3, in place of V1 and V2.

Figure 7:
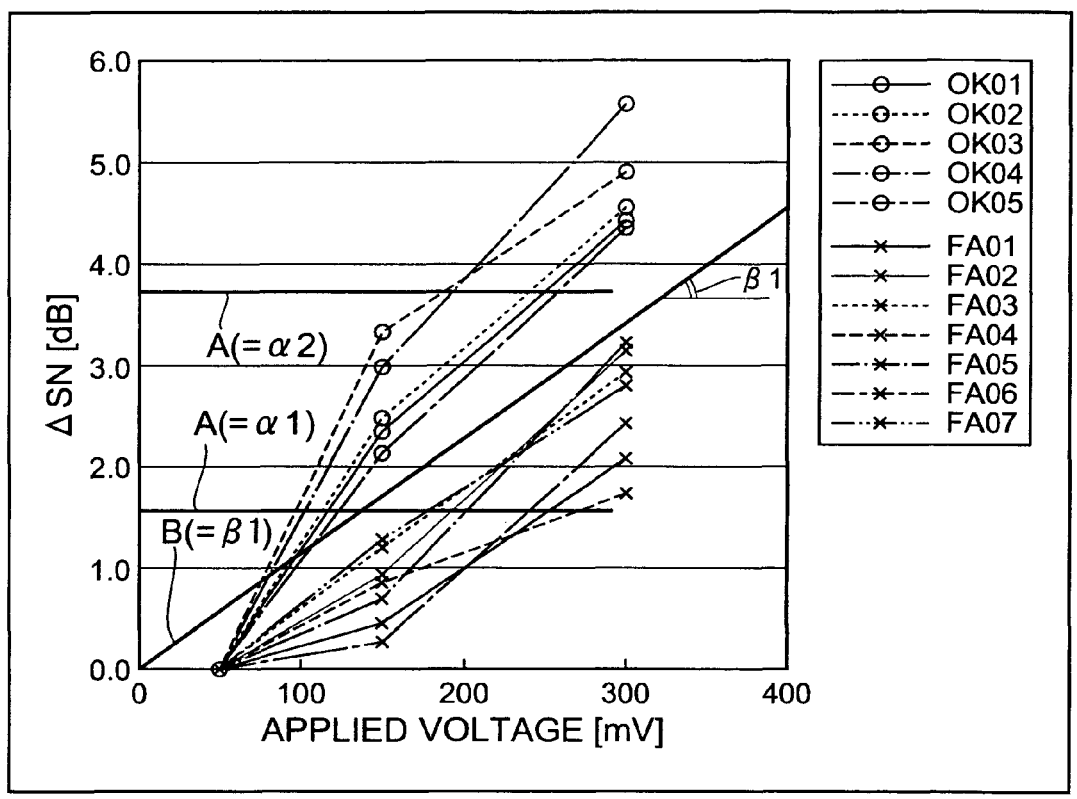
FIG. 7 is a graph showing a relationship of applied voltage and ΔSN.

FIG. 7 is a graph showing the relationship of an applied voltage and ΔSN.

An inspection of MR elements of sample numbers OK01 to OK05, and FA01 to FA07, is performed at room temperature. Room temperature is generally 40° C. or less, and a temperature of 27° C. (300 K) is used in this experiment. The SN ratios of the MR elements of the sample numbers OK01 to OK05 do not significantly deteriorate even when the surrounding ambient temperature is increased to a high temperature. However, the SN ratios of the MR elements of the sample numbers FA01 to FA07 significantly deteriorate when the surrounding ambient temperature is increased to a high temperature. The ambient temperature at a high temperature is approximately 100° C. As used herein, an MR element in which the SN ratio significant deteriorates means an MR element in which the SN ratio decreases by 2 dB or more in comparison to the SN ratio at room temperature.

The MR elements used in the experiment are MR elements of a foundation layer, an antiferromagnetic layer {IrMn (7 nm)}, a laminated ferri-pinned layer {CoFe (3 nm)/Ru (0.8 nm)/CoFe (2 nm)}, a tunnel barrier layer {MgO (1.5 nm)}, and a free layer {CoFe (3 nm)}. Thickness is indicated in parenthesis.

An external heater can be used to increase the temperature, however a built-in heater HT is controlled from a heater control circuit CONT3 in the present example. The control state of the heater HT is displayed on the display device DSP.

The ΔSN values (V2=150 mV and V1=50 mV) are plotted at a position corresponding to an applied voltage of 150 mV. The ΔSN values of the samples of the sample numbers OK01 to OK05 are all greater than or equal to the threshold value A (=α1). The ΔSN values of the samples of the sample numbers FA01 to FA07 are all less than the threshold value A (=α1).

The ΔSN values (V3=300 mV and V2=150 mV) are also plotted at a position corresponding to an applied voltage of 300 mV. The ΔSN values of the samples of the sample numbers OK01 to OK05 are all greater than or equal to the threshold value A (=α2). The ΔSN values of the samples of the sample numbers FA01 to FA07 are all less than the threshold value A (=α2).

A reference line B formed from a straight line having a slope of β1 can also be used to differentiate between the samples of the sample numbers OK01 to OK05 and the samples of the sample numbers FA01 to FA07. The reference line B passes through the origin of an applied voltage of 0 mV. Excluding the ΔSN values at 50 mV, it is possible to determine that samples having a ΔSN greater than or equal to the value on the reference line B are non-defective products, and that samples having a ΔSN less than the value on the reference line B are defective products. The formula for the reference line B is as follows: $\Delta SN = \beta 1 \times V$.

If the ΔSN value on the reference line B at a voltage of 150 mV is set to α1, and the ΔSN value on the reference line B at a voltage of 300 mV is set to α2, then when a product is determined to be a non-defective product in both the above-described determination method 1 and the above-described determination method 2, the MR element is ultimately determined to be a non-defective product, however when this is not the case, the MR element is determined to be a defective product. It is also possible to set the slope of β1 to the average value of the slopes of the ΔSN line segments of the non-defective samples from between the applied voltages of 50 mV to 300 mV shown in FIG. 7.

As described above, the inspection step in the method of manufacturing a magnetic device comprises the steps of: (a) sequentially applying a plurality of different voltages of V1, V2, and V3 to the MR element, and sequentially detecting output signals from the MR element, and (b) determining the MR element to be a defective product and eliminating the MR element, when at least one evaluation value (preferably equivalent to the ΔSN) based on the difference (the ΔSN) of the SN ratios of the output signals from the MR element obtained respectively for each applied voltage of V1, V2, and V3, is less than a first threshold value (A (α1)), and determining the MR element to be a non-defective product and selecting the MR element, when the at least one evaluation value is greater than or equal to the first threshold value (A (α1)).

Moreover, when the number of evaluation values (preferably the ΔSN) is plural (the ΔSN at 150 mV and the ΔSN at 300 mV) and an evaluation value (the ΔSN at 300 mV) different from the evaluation value at 150 mV is less than a second threshold value (A (=α2)), the MR element is eliminated as a defective product even if the evaluation value (the ΔSN at 150 mV) in the step (b) is greater than or equal to the first threshold value (A (=α1)).

Figure 8:
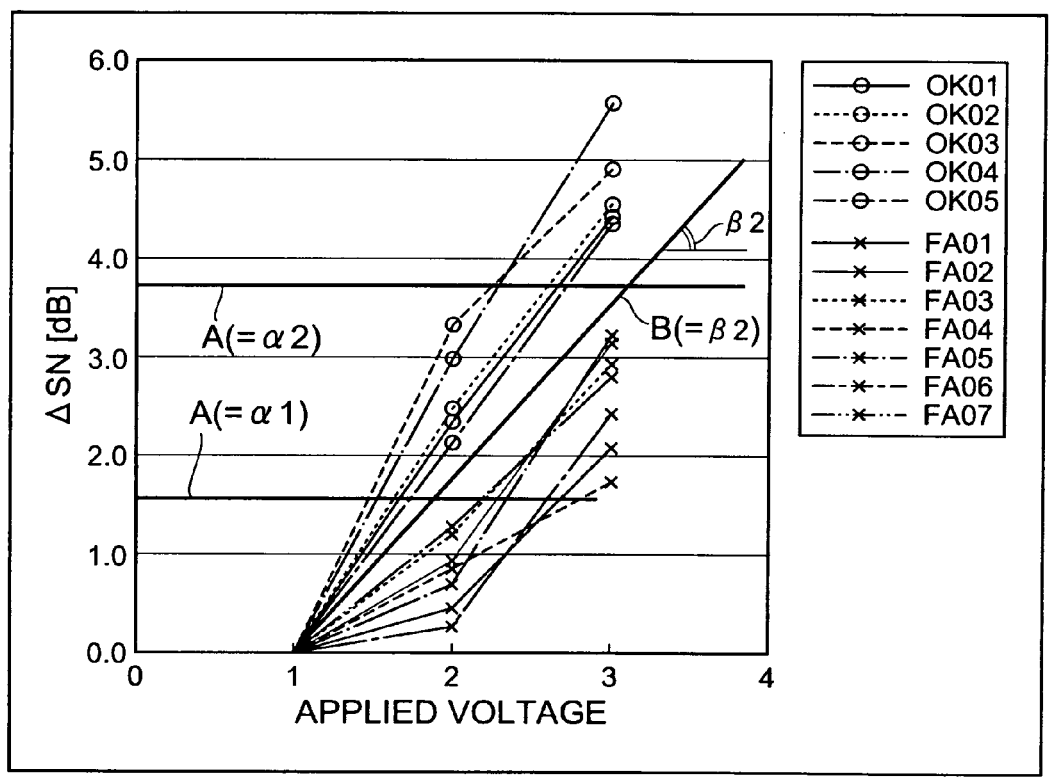
FIG. 8 is a graph showing a relationship of applied voltage and ΔSN.

FIG. 8 is a graph showing a relationship of a normalized applied voltage and ΔSN. The graph of FIG. 8 is obtained by normalizing the applied voltage in the graph of FIG. 7 at the applied voltage of V1 equaling 50 mV.

In the determination performed using the above-described determination method 1 and/or the above-described determination method 2, the threshold value A may be used in the same manner.

A reference line B has a slope of β2, and the ΔSN is zero when the normalized applied voltage is 1 (equaling the applied voltage of 50 mV prior to normalization). In this case, when the normalized applied voltage is in a range larger than 1, the samples (OK01 to OK05) having a ΔSN greater than or equal to the value on the reference line B (the slope of β2) are all determined to be non-defective products, that is "J=1," and the samples (FA01 to FA07) having a ΔSN less than the value on the reference line B (the slope of β2) are all determined to be defective products, that is "J=0." If the value on the reference line B is assumed as the above-described threshold value A, this determination is identical to the above-described determination method 1 and/or the above-described determination method 2. The formula of the reference line B is as follows: $\Delta SN = (\beta 2 \times V) - \beta 2$.

Note that the ΔSN value may also have a correction factor. In cases in which a correction factor according to a measurement device, correction factors due to ambient temperature and pressure, and so on have to be considered, it is possible to set a new ΔSN by adding/subtracting these correction factors as needed and to set this new ΔSN as the final evaluation value. The MR element may be determined to be a non-defective product when the evaluation value is greater than or equal to the threshold value A, and may be determined to be a defective product when the evaluation value is less than the threshold value A.

On the other hand, in a case in which the above-described ΔSN is not used, it is not possible to differentiate between non-defective products and defective products at room temperature.

Figure 9:
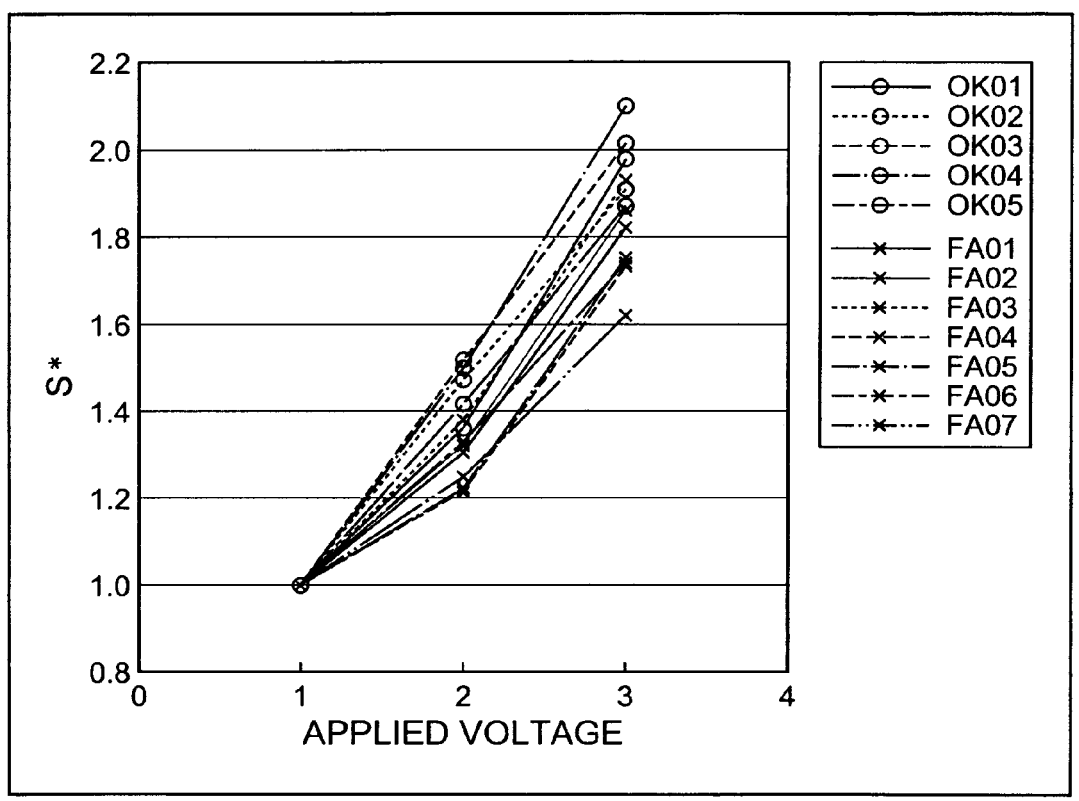
FIG. 9 is a graph showing a relationship of applied voltage and S*.

FIG. 9 is a graph showing a relationship of an applied voltage and signal component S*. In FIG. 9, the applied voltage is normalized at 50 mV, the magnitude of the signal component S is also normalized at a value when the applied voltage is 50 mV, and the normalized signal component is indicated by an S*. As can be understood from this graph, line segments indicating data of non-defective products and line segments indicating data of defective products are mixed, and as such non-defective products and defective products cannot be separated based upon the data of the signal components S* only.

Figure 10:
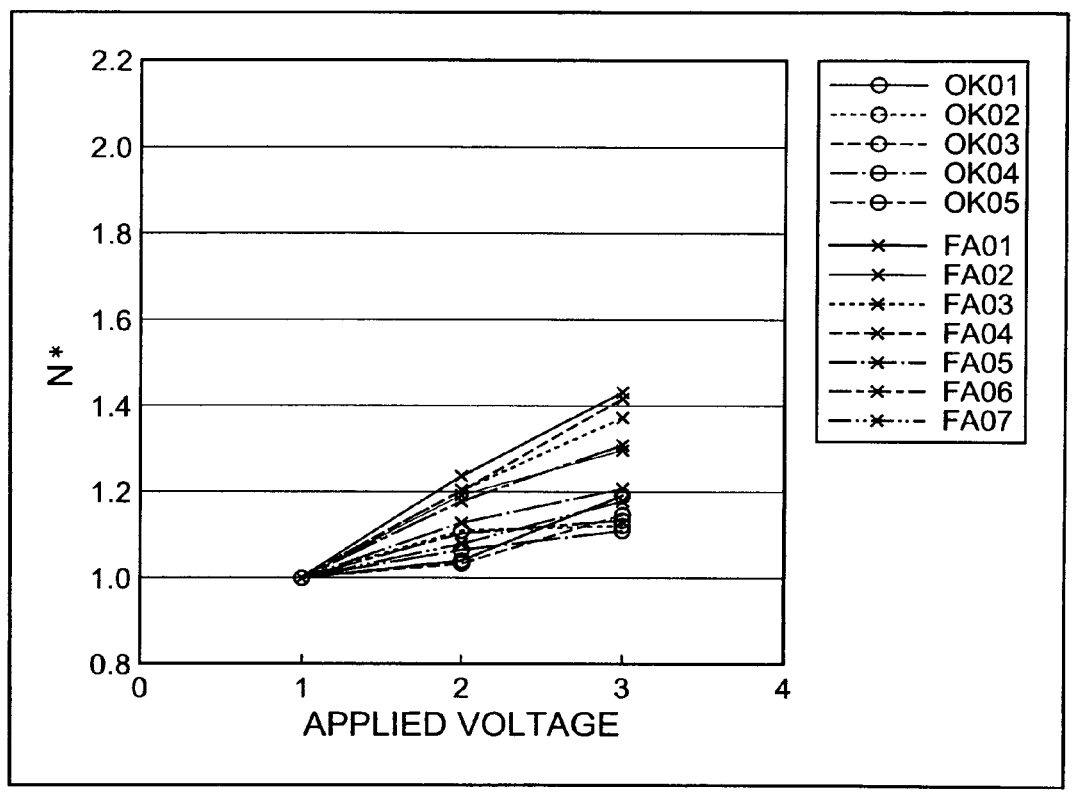
FIG. 10 is a graph showing a relationship of applied voltage and N*.

FIG. 10 is a graph showing a relationship of an applied voltage and noise component N*. In FIG. 10, the applied voltage is normalized at 50 mV, the magnitude of the noise component N is also normalized at a value when the applied voltage is 50 mV, and the normalized noise component is indicated by an N*. As can be understood from this graph, line segments indicating data of non-defective products and line segments indicating data of defective products are mixed, and as such non-defective products and defective products cannot be separated based upon the data of the noise components N* only.

FIG. 11 is a table showing data used to create the above-described graphs, and showing the relationship of S*, N*, and ΔSN for each sample for different applied voltages. FIG. 12 is a table showing data used to create the above-described graphs, and showing the relationship of S, N, and SN for each sample for different applied voltages.

The steps following the above-described differentiation will be described by referring again to FIG. 5. The selector SEL performs an inspection of the MR element 1B included in a manufactured product (including a semifinished product) which has passed through a production line. When a determination result of the calculation circuit CONT4 indicates a non-defective product, that is "J=1," the selector SEL selects this product and transports it to the next step, and when the determination result indicates a defective product, that is "J=0," the selector SEL eliminates this product thereby removing it from the production line.

As described above, the inspection device comprises the output monitor circuit (detection means) CONT2 which sequentially applies a plurality of different voltages to the MR element, and sequentially detects output signals from the MR element, and a calculation circuit (calculation means) CONT4 which determines the MR element to be a defective product, when an evaluation value (the ΔSN) based on the difference between the SN ratios of the output signals from the MR element respectively obtained for each applied voltage which are detected by the output monitor circuit CONT2, is less than the threshold value A, and determines that the MR element to be a non-defective product when the evaluation value (the ΔSN) is greater than or equal to the threshold value A. The results of differentiation of the calculation circuit CONT4 are displayed on the display device DSP.

The selector SEL is, for example, formed from a robot arm. However, it is also possible for a person to perform sorting in this method of manufacturing.

Note that, the signal component S, and the noise component N can be obtained in the following manner. The signal component S is obtained by extracting a component that changes in synchronization with a media magnetic field or an external magnetic field. The noise component N is obtained by extracting a component not synchronized with a magnetic field. Alternatively, an output measured in a state in which a magnetic field is not applied may be used as the noise component N.

When measuring the output of the MR element after assembly of the hard disk device, a pulse-shaped output signal can be obtained from the MR element if a magnetic disk on which appropriate magnetic information is written is rotated, while before assembly of the hard disk device, a magnetic field applied to the MR element at the time of the magnetic disk rotation may be simulatively applied to the MR element from the outside.

The above-described inspection step may be carried out at various stages in the magnetic head manufacturing process.

Figure 13:
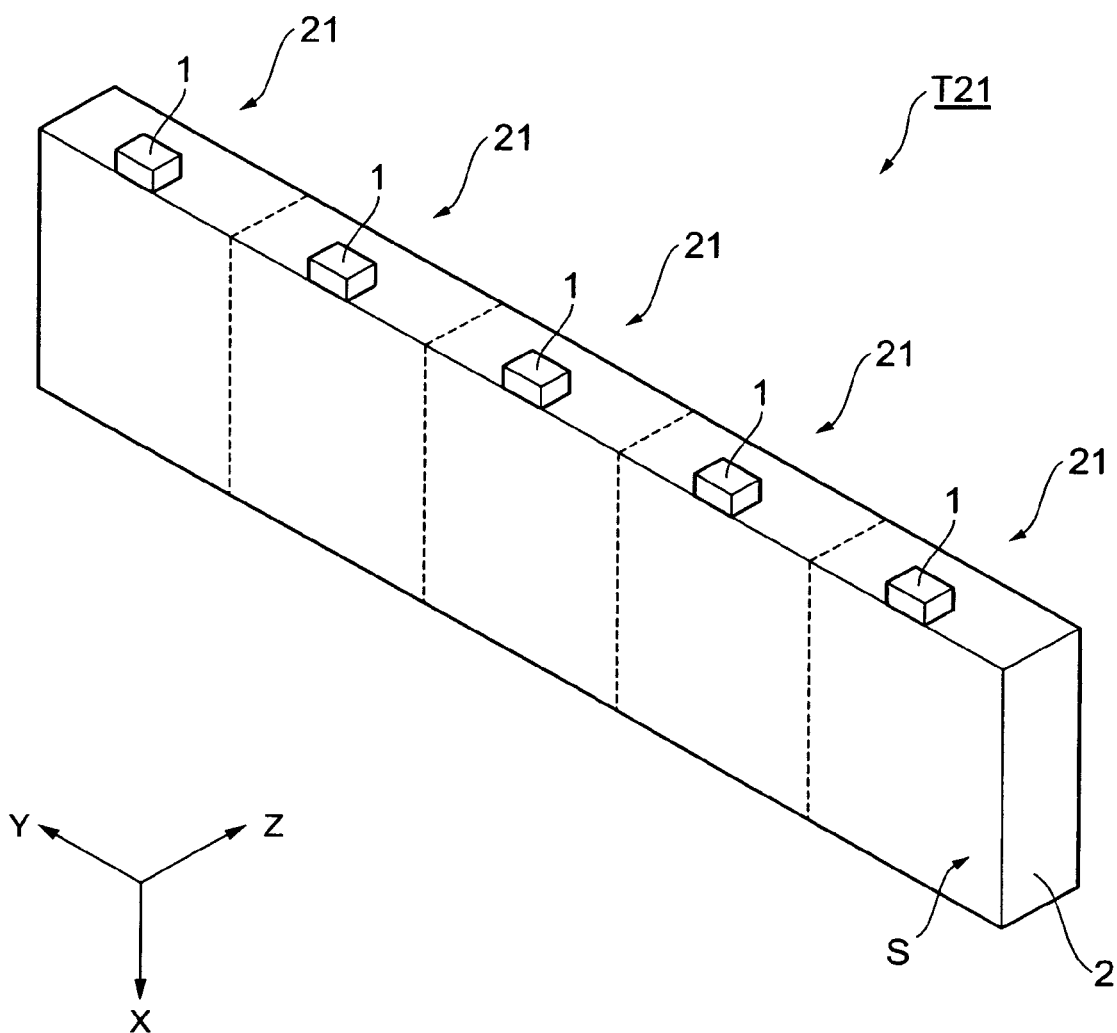
FIG. 13 is a perspective view of a magnetic head bar.

FIG. 13 is a perspective view of a magnetic head bar.

A plurality of magnetic heads 21 are integrally connected along a Y-axis and configure a magnetic head bar T21. When the magnetic head bar T21 is diced along the dotted lines in the drawing, each magnetic head 21 is separated, and the magnetic head 21 shown in FIG. 3 is manufactured. It is possible to implement the inspection step for the magnetic head portion 1 once this magnetic head bar T21 is formed. The magnetic heads 21 included in each bar have management numbers, and after the non-defective products/the defective products are determined in association with the management numbers, the magnetic heads 21 determined to be defective products are discarded following dicing.

Figure 14:
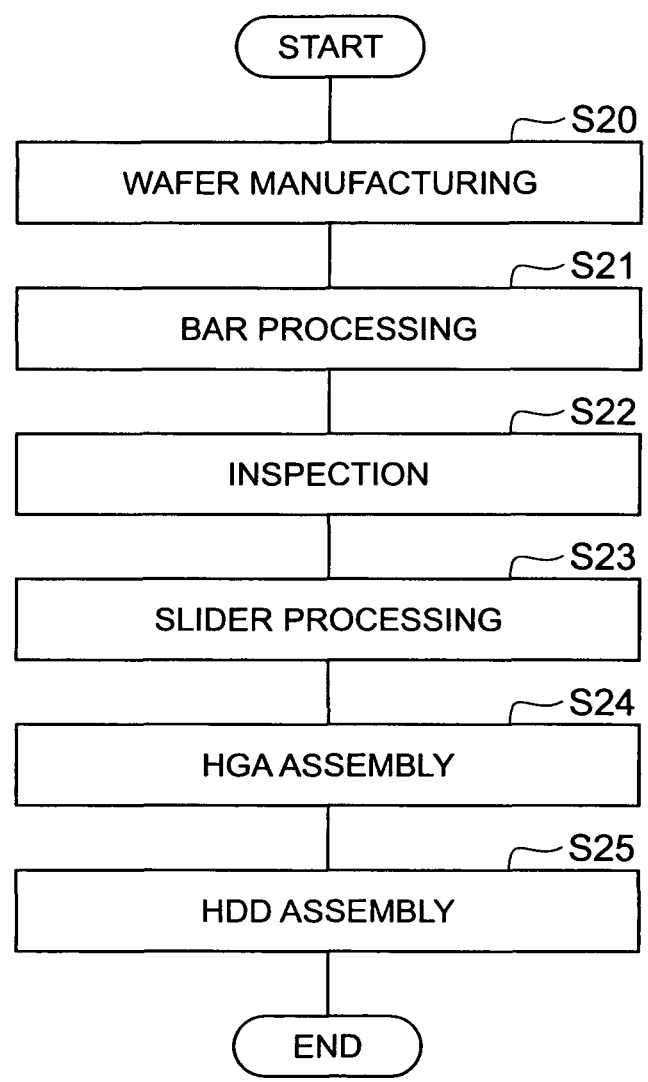
FIG. 14 is a flow chart of a method of manufacturing.

FIG. 14 is a flow chart of a method of manufacturing.

First, a wafer in which a thin film magnetic head is formed is manufactured (S20). Methods described in, for example, U.S. Patent Application Publication No. 2006/0216837, and U.S. Patent Application Publication No. 2006/0221511 are incorporated herewith by reference as a method of forming the thin film magnetic head on the wafer. Next, the wafer is subjected to dicing to manufacture the bar shown in FIG. 13 (S21). Following this, the inspection step described using FIG. 6 and the like is implemented (S22). Furthermore, the magnetic head bar is diced, and the magnetic heads are separated per slider substrate (S23). As for these dicing methods, the method described in U.S. Pat. No. 6,859,678, for example, is incorporated herewith by reference. Next, the HGA is produced by fixing the magnetic head to the suspension with an adhesive or the like as shown in FIG. 2 (S24). Furthermore, this HGA is incorporated into the hard disk device, and thereby the hard disk device shown in FIG. 1 is assembled (S25). As a method of attaching the HGA, the methods described in, for example, U.S. Patent Application Publication No. 2005/0200237 and U.S. Pat. No. 6,847,507 are incorporated herewith by reference.

Figure 15:
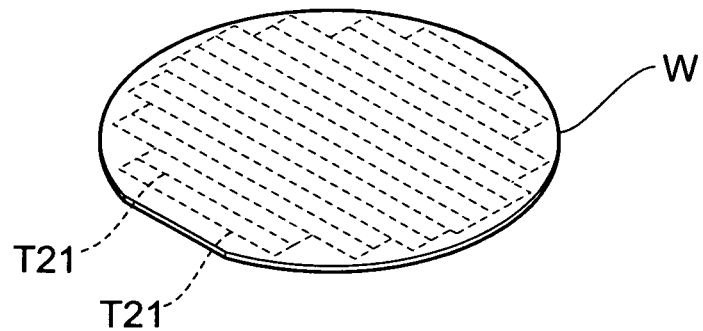
FIG. 15 is a perspective view of a wafer.

FIG. 15 is a perspective view of the wafer.

As previously descried, the wafer W comprises the magnetic head bars T21 integrally connected to one another. In other words, by dicing the wafer W along the dotted lines in the drawing, the magnetic head bar T21 shown in FIG. 6 is manufactured. The magnetic head portion 1 is formed on the wafer W. It is possible to implement the above-described inspection step for the magnetic head portion 1 once the wafer W is formed. The magnetic heads 21 included in each bar T21 have management numbers, and after the non-defective products/the defective products are determined in association with the management numbers, the magnetic heads 21 determined to be defective products are discarded following the dicing of the wafer or the magnetic head bar.

Figure 16:
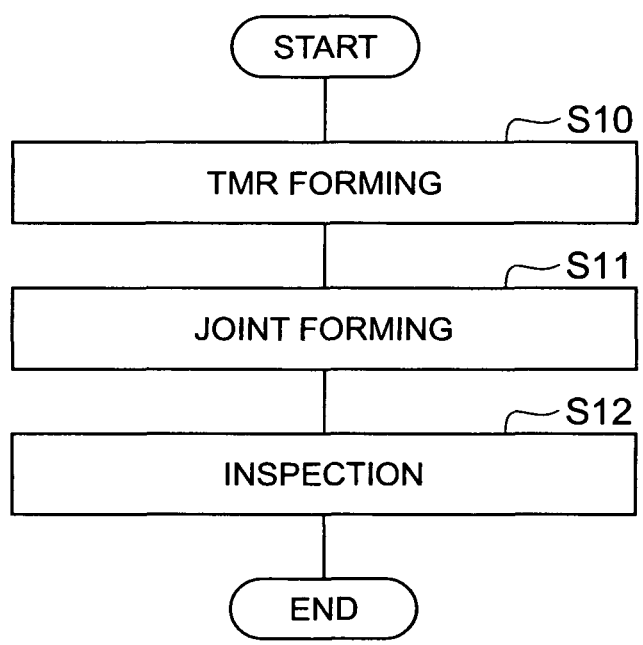
FIG. 16 is a flow chart of a method of manufacturing.

FIG. 16 is a flow chart of a method of manufacturing.

A TMR element is formed on the wafer W (S10), and then each electrode is joined to the MR elements (S11). Thereafter, the above-described inspection step is implemented (S12), and thereby defective products are eliminated, and non-defective products are selected. Note that, after the inspection step, the non-defective product may be successively subjected to the above-described remaining steps S21, S23, S24, and S25.

Figure 17:
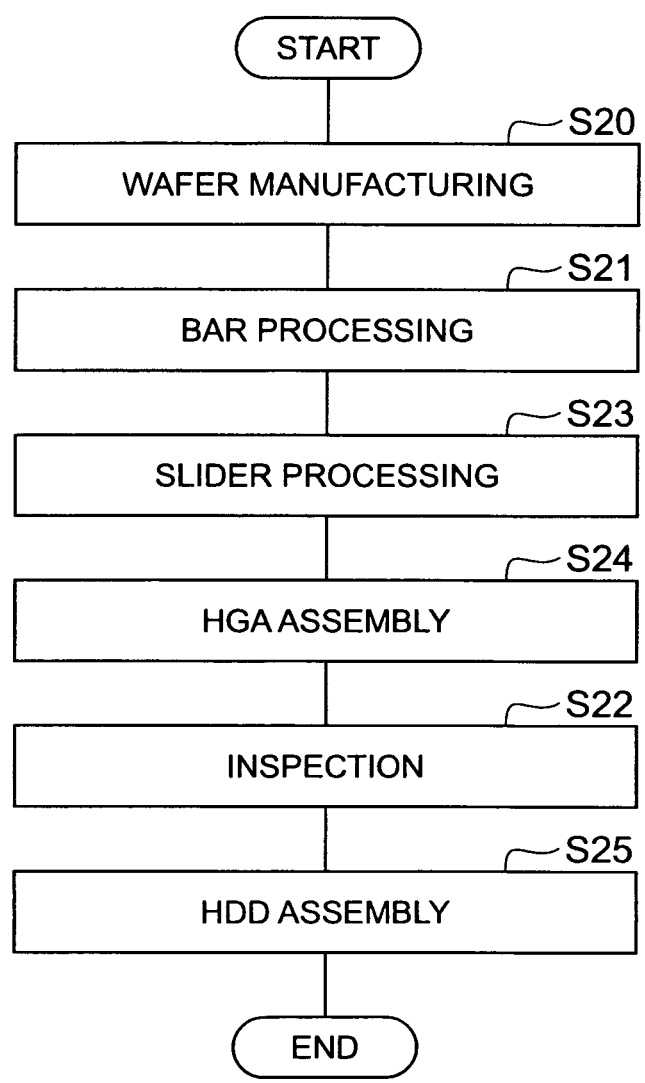
FIG. 17 is a flow chart of a method of manufacturing.

FIG. 17 is a flow chart of a method of manufacturing.

In this flow chart, the above-described inspection step is implemented after the above-described steps S20, S21, S23, and S24 are successively implemented (S22). In other words, inspection is performed in a state in which the magnetic head is attached to the HGA, and assembly of the hard disk device is performed after selection of the non-defective products (S25).

Figure 18:
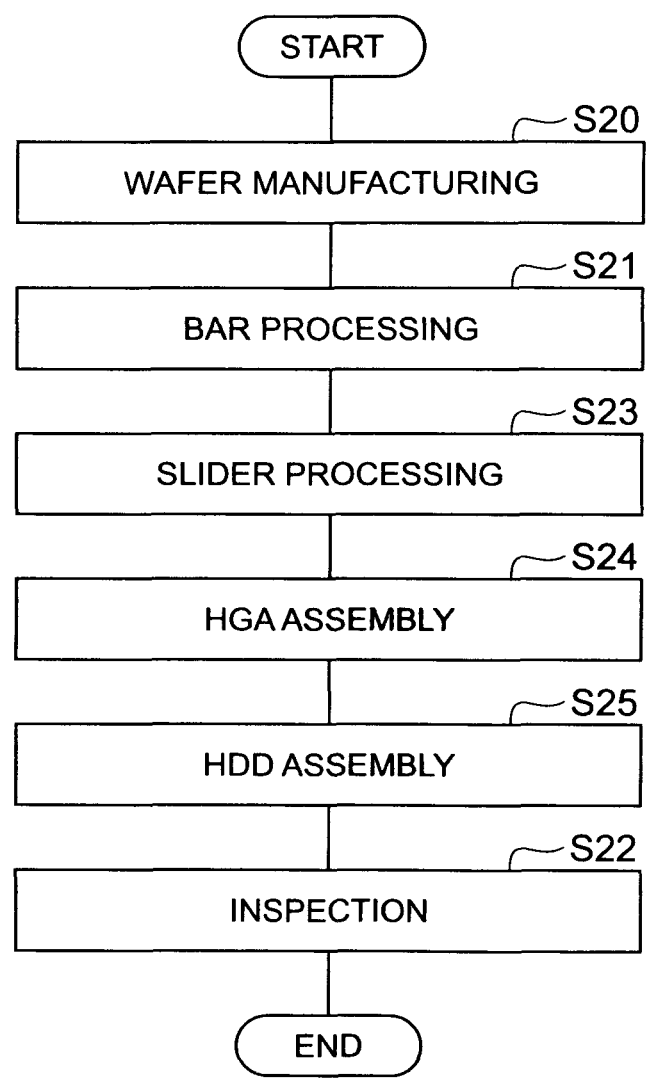
FIG. 18 is a flow chart of a method of manufacturing.

FIG. 18 is a flow chart of a method of manufacturing.

In this flow chart, the above-described inspection step is implemented after the above-described steps S20, S21, S23, S24, and S25 are successively implemented (S22). In other words, inspection is performed in a state in which the HGA is attached to the hard disk device, and following this the non-defective products are sorted and then shipped.

What is claimed is:

1. A method of manufacturing a magnetic device, comprising the steps of:
    (a) sequentially applying a plurality of different voltages to a magnetoresistive (MR) element and sequentially detecting output signals from the MR element, the output signals being respectively obtained for each applied voltage; and
    (b) eliminating the MR element as a defective product when at least one evaluation value based on a difference of signal-to-noise (SN) ratios of the output signals is less than a first threshold value, and selecting the MR element as a non-defective product when the at least one evaluation value is greater than or equal to the first threshold value.

2. The method of manufacturing a magnetic device according to claim 1, wherein the at least one evaluation value is a difference of the SN ratios.

3. The method of manufacturing a magnetic device according to claim 1, further comprising a step of eliminating the MR element as a defective product when the number of evaluation values is plural and an evaluation value different from the at least one evaluation value of the step (b) is less than a second threshold value, even if the at least one evaluation value of the step (b) is greater than or equal to the first threshold value.

4. The method of manufacturing a magnetic device according to claim 1, further comprising a step of attaching the MR element selected as the non-defective product in the step (b) to a head gimbal assembly.

5. The method of manufacturing a magnetic device according to claim 1, further comprising
    a step of attaching the MR element to a head gimbal assembly,
    wherein the step (a) is performed after the MR element is attached to the head gimbal assembly.

6. A method of manufacturing a magnetic device, comprising the steps of:
    (a) sequentially applying a plurality of different voltages to a magnetoresistive (MR) element and sequentially detecting output signals from the MR element;
    (b) obtaining a first signal-to-noise (SN) ratio of the output signals for a first voltage of the plurality of different voltages and obtaining a second SN ratio of the output signals for a second voltage of the plurality of different voltages;
    (c) calculating a difference between the first and the second SN ratios and basing an evaluation value of the MR element on the calculated difference; and
    (d) eliminating the MR element as a defective product when the evaluation value is less than a first threshold value, and selecting the MR element as a non-defective product when the evaluation value is greater than or equal to the first threshold value.

7. The method of manufacturing a magnetic device according to claim 6, further comprising the steps of:
    (e) obtaining a third SN ratio of the output signals for a third voltage of the plurality of different voltages;
    (f) calculating a difference between the second and the third SN ratios and basing an other evaluation value of the MR element on the calculated difference; and
    (g) eliminating the MR element as a defective product when the other evaluation value is less than a second threshold value, even if the evaluation value of the step (c) is greater than or equal to the first threshold value.

* * * * *